(12) United States Patent
Lee et al.

(10) Patent No.: US 6,702,594 B2
(45) Date of Patent: Mar. 9, 2004

(54) ELECTRICAL CONTACT FOR RETAINING SOLDER PREFORM

(75) Inventors: Genn-Sheng Lee, Tu-Chen (TW); Ming-Lun Szu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/020,567

(22) Filed: Dec. 14, 2001

(65) Prior Publication Data

US 2003/0114029 A1 Jun. 19, 2003

(51) Int. Cl.⁷ .................. H01R 12/00; H05K 1/00
(52) U.S. Cl. .................................. 439/83; 439/70
(58) Field of Search ........................ 439/83, 342, 70

(56) References Cited

U.S. PATENT DOCUMENTS

| | | | | |
|---|---|---|---|---|
| 5,791,929 A | * | 8/1998 | Banakis et al. ............. 439/342 |
| 6,142,792 A | * | 11/2000 | Yang ............................ 439/70 |
| 6,155,845 A | * | 12/2000 | Lin et al. ..................... 439/83 |
| 6,217,348 B1 | * | 4/2001 | Lin et al. ..................... 439/83 |
| 6,352,437 B1 | * | 3/2002 | Tate ............................ 439/83 |
| 6,371,784 B1 | * | 4/2002 | Scholz et al. ............... 439/342 |
| 6,450,826 B1 | * | 9/2002 | Howell et al. .............. 439/342 |
| 2003/0013330 A1 | * | 1/2003 | Takeuchi .................... 439/83 |
| 2003/0092304 A1 | * | 5/2003 | Whyne et al. .............. 439/342 |

\* cited by examiner

*Primary Examiner*—Chandrika Prasad
(74) *Attorney, Agent, or Firm*—Wei Te Chung

(57) ABSTRACT

A contact for being received in an electrical socket which interconnects an integrated circuit (IC) package with a printed circuit board (PCB), comprises a contact portion for electrically connecting with a pin of the IC package, a locating portion for interferentially engaging with insulative housing of the electrical socket, and a tail portion having a plurality of clip arms. When a solder block is inserted into the tail portion, the clip arms can deflect to secure the solder block in a predetermined position in the tail portion.

9 Claims, 6 Drawing Sheets

ELECTRICAL CONTACT FOR RETAINING SOLDER PREFORM

BACKGROUND OF THE INVENTION

1. Field of the Invention

The present invention relates to a ball grid array (BGA) connector, especially to a ball grid array socket having electrical contacts for retaining corresponding solder balls in position.

2. Description of the Prior Art

As shown in FIG. 6, a conventional BGA socket 5 is mounted on a printed circuit board (PCB) 6. A solder ball 51 is soldered on a tail 52 of the socket 5 in advance and is then soldered on the printed circuit board 6 via an infrared reflow process. The coplanarity of solder balls 51 is a critical factor of soldering quality for the BGA socket 5.

However, when the solder ball 51 is melted and soldered on the tail 52, position of each solder ball 51 is hard to be controlled in one plane after the solder ball 51 is soldered on the tail 52. This coplanarity problem can result in the failure of electrical connection when the socket 5 is soldered to the PCB via the solder ball 51. Furthermore, when the solder ball 51 is soldered to the contact 50, solder wicking is another difficult problem needing to be solved. Solder wicking is a well known problem in the electrical industry. During the soldering process of electrical contacts to printed circuit boards, the molten solder and flux flow up contact tails of the terminals due to the surface tension (i.e., capillary effect) and adversely affect electrical properties of the contact element. Therefore, it is desired to have an improved contact which can guarantee the coplanarity of the solder balls and prevent the unwanted solder wicking.

SUMMARY OF THE INVENTION

An object of the present invention is to provide a plurality of contact elements capable of keeping solder balls coplanarity when the solder balls are engaged with the contact elements.

Another object of the present invention is to provide a plurality of contact elements capable of suppressing solder wicking during a soldering process.

In order to achieve the objects set forth, a contact received in an electrical socket for interconnecting an integrated circuit (IC) package with a printed circuit board (PCB), comprises a contact portion for electrically connecting with a pin of the IC package, a location portion for interferentially engaging with insulative housing of the electrical socket, and a tail portion has a plurality of clip arms. Wherein when a solder block is inserted into the tail portion, the clip arms can deflect and whereby secure the solder block in a predetermined position in the tail portion.

Other objects, advantages and novel features of the present invention will be drawn from the following detailed description of preferred embodiments of the present invention with attached drawings, in which:

DESCRIPTION OF THE PREFERRED EMBODIMENTS

Figure 1:
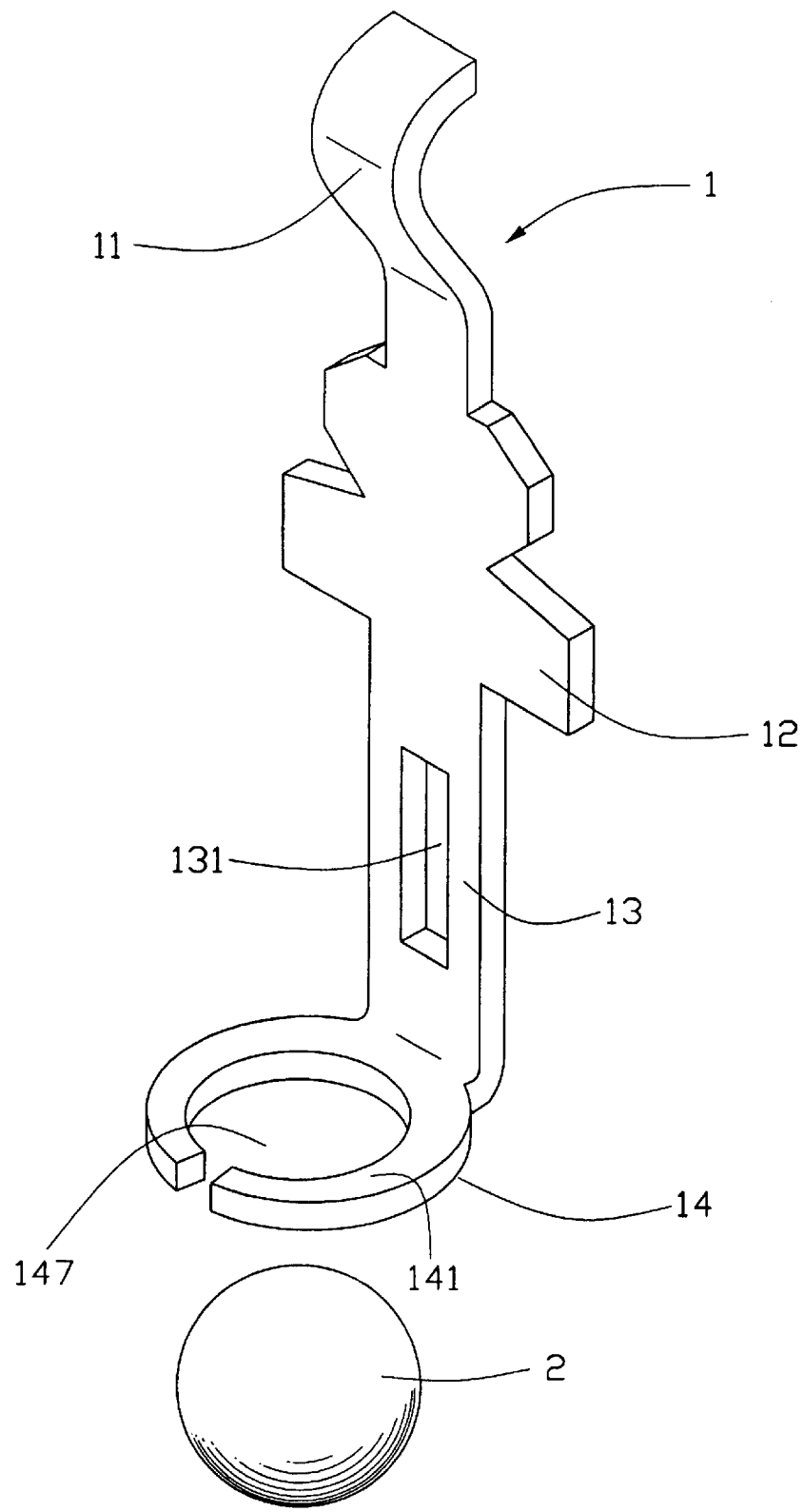
FIG. 1 is a perspective view of a contact in accordance with a preferred embodiment of the present invention.

For facilitating understanding, like components are designated by like reference numerals throughout the various embodiments of the invention as shown in the various drawing figures.

Figure 2:
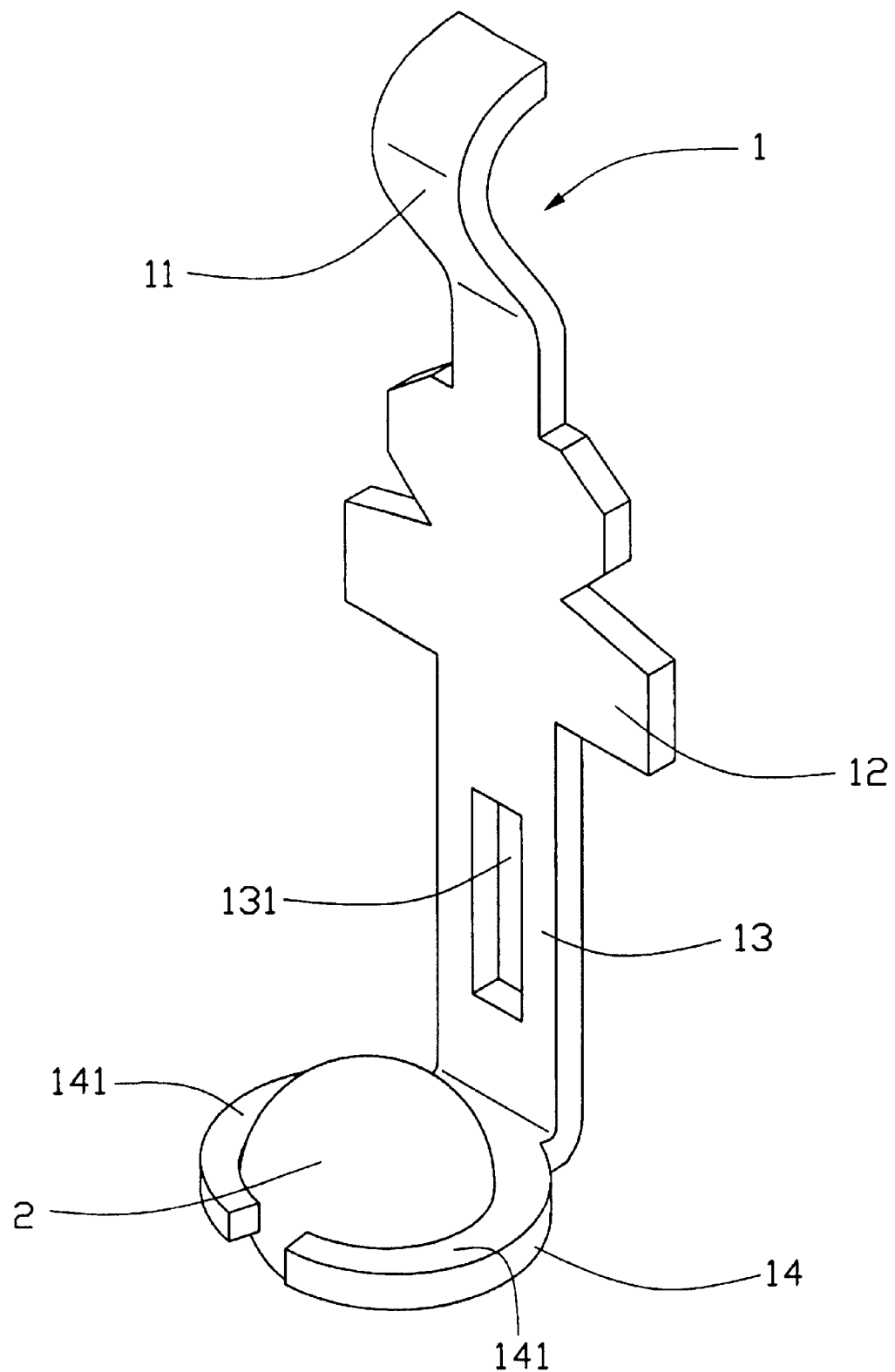
FIG. 2 is an assembled view of FIG. 1.

Referring to FIGS. 1 and 2, a contact 1 in accordance with a first embodiment of the present invention comprises a contact portion 11 for electrically connecting with a pin of a central processing unit (not shown), a locating portion 12 for securing the contact 1 in an insulative housing of an electrical connector (not shown), a tail portion 14 for clipping a solder block 2, and a connection portion 13 for connecting the location portion 12 with the tail portion 14. An opening 131 is formed in the connection portion 13 for preventing solder wicking during soldering process. The tail portion 14 has two clip arms 141, and the clip arms 141 form a ring-shaped clip section 147 therebetween. Initially, the clip section 147 is small relative to the solder block 2. During insertion process of the solder block 2, the solder block 2 presses the clip arms 141 outwardly whereby the clip section 147 becomes larger. When the solder block 2 is inserted into the clip section 147 to a predetermined position, the clip arms 141 can secure the solder block 2 firmly in the clip section 147. When a plurality of solder blocks 2 is inserted into a plurality of clip sections 147 simultaneously via a plate (not shown), coplanarity of the solder blocks 2 can be guaranteed.

Figure 3:
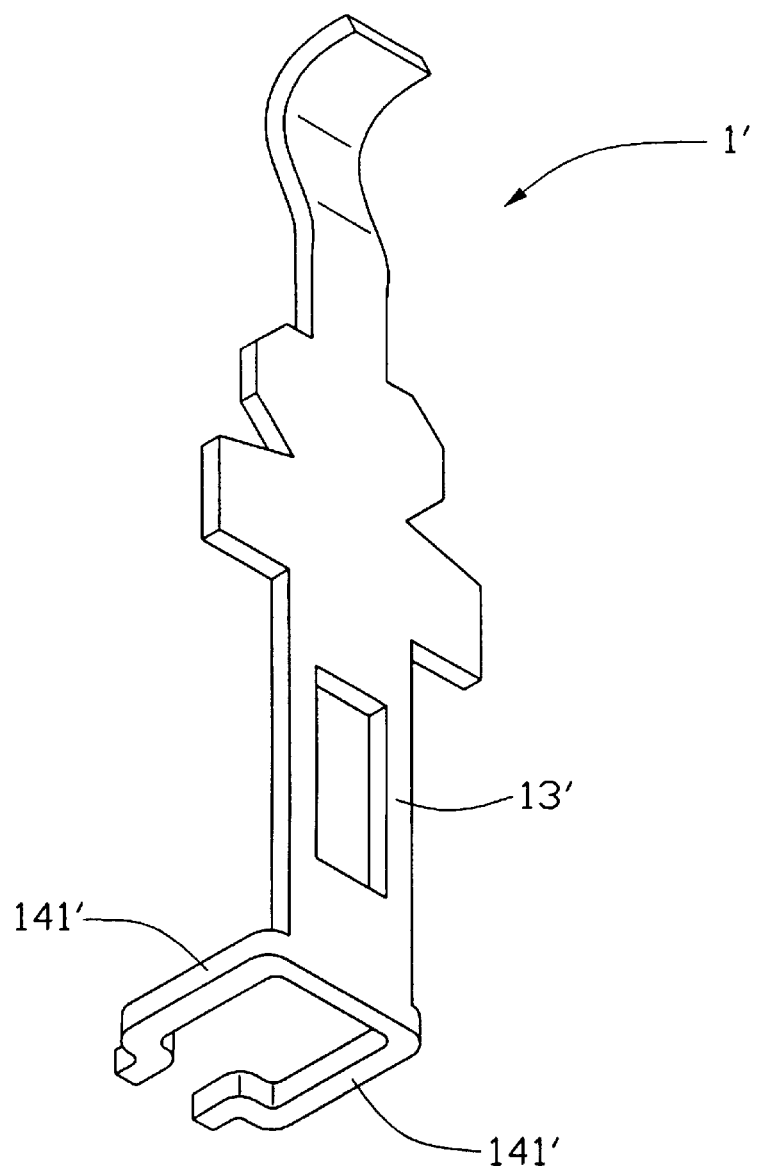
FIG. 3 is a perspective view of a contact in accordance with a second embodiment of the present invention.
Figure 3:
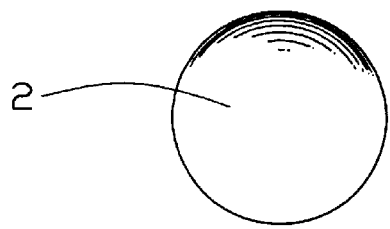

Referring to FIG. 3, a contact 1' in accordance with a second embodiment of the present invention comprises a connection portion 13', and two clip arms 141' extending from the connection portion 13' for securing the solder ball2 therebetween. The clip arms 141' have portions substantially parallel to each other for interferentially engaging with the solder ball2.

Figure 4:
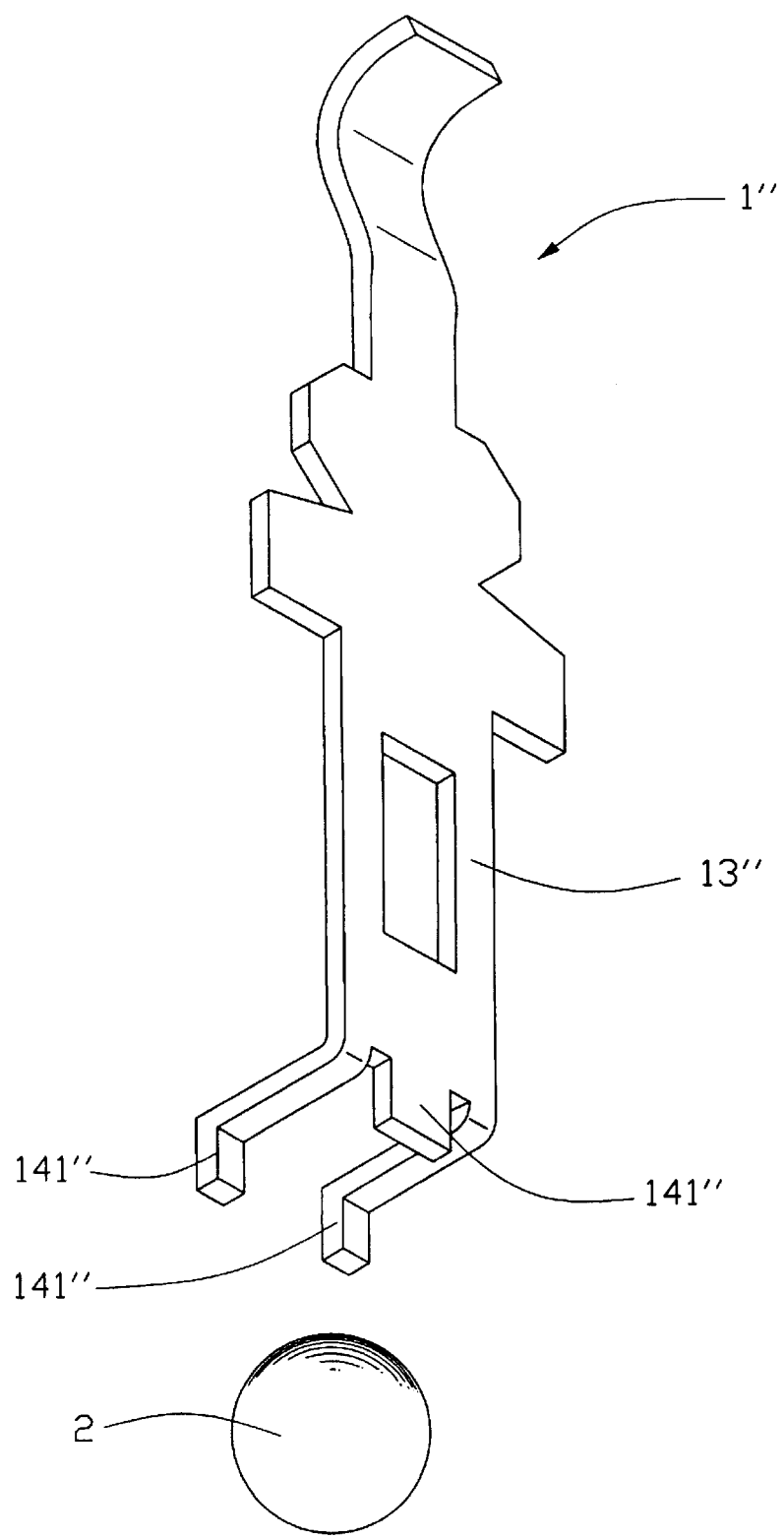
FIG. 4 is a perspective view of a contact in accordance with a third embodiment of the present invention.

Referring to FIG. 4, a contact 1" in accordance with a third embodiment of the present invention comprises a connection portion 13", and three clip arms 141" extending from the connection portion 13" for clipping the solder block 2 therebetween. Two clip arms 141" are substantially L-shaped configurations and extend parallelly to each other, and one clip arm 141' extends perpendicularly to the two clip arms, whereby the solder block 2 can be interferentially engaged with the three clip arms 141".

Figure 5:
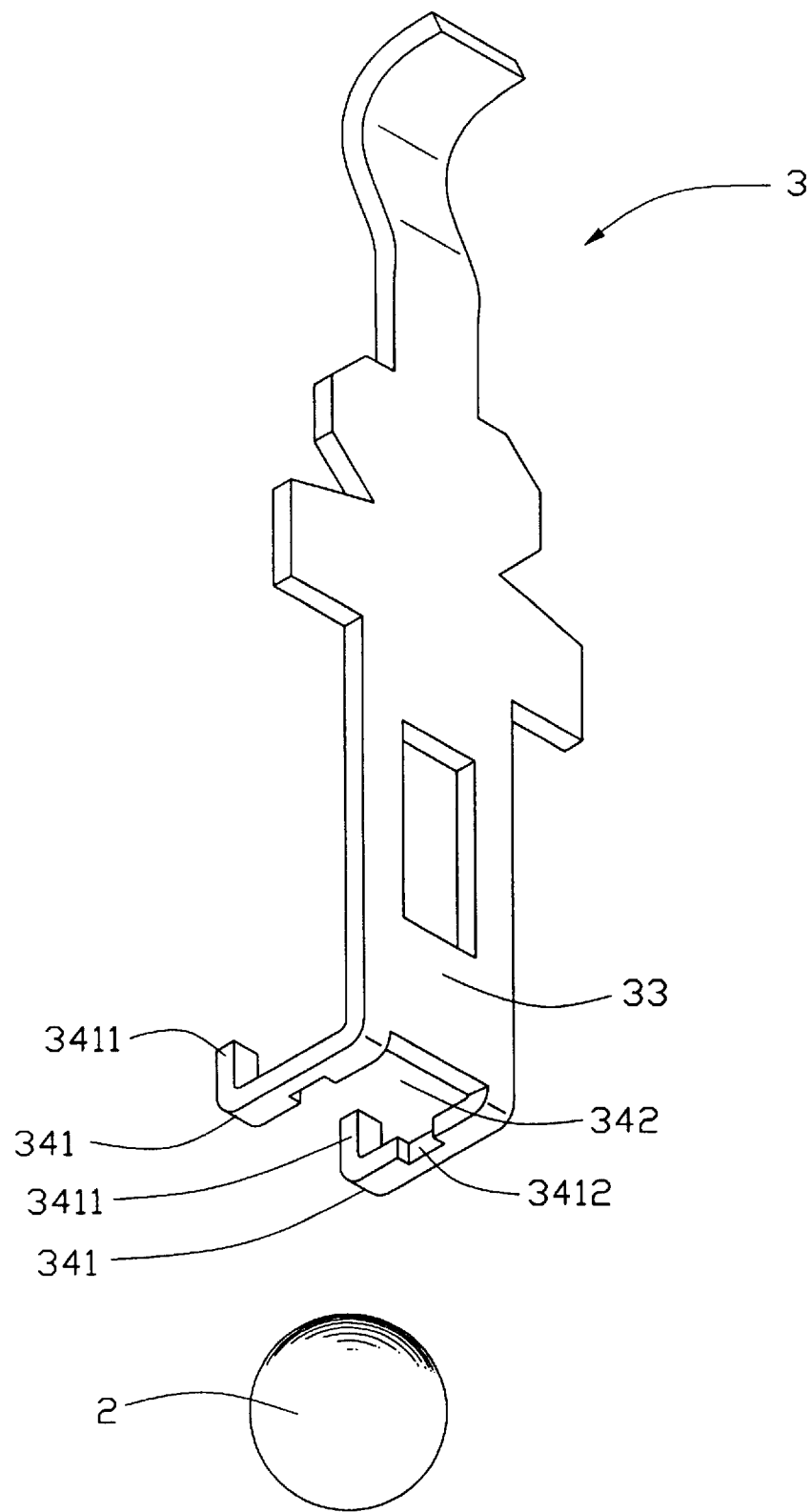
FIG. 5 is a perspective view of a contact in accordance with a fourth embodiment of the present invention.
Figure 6:
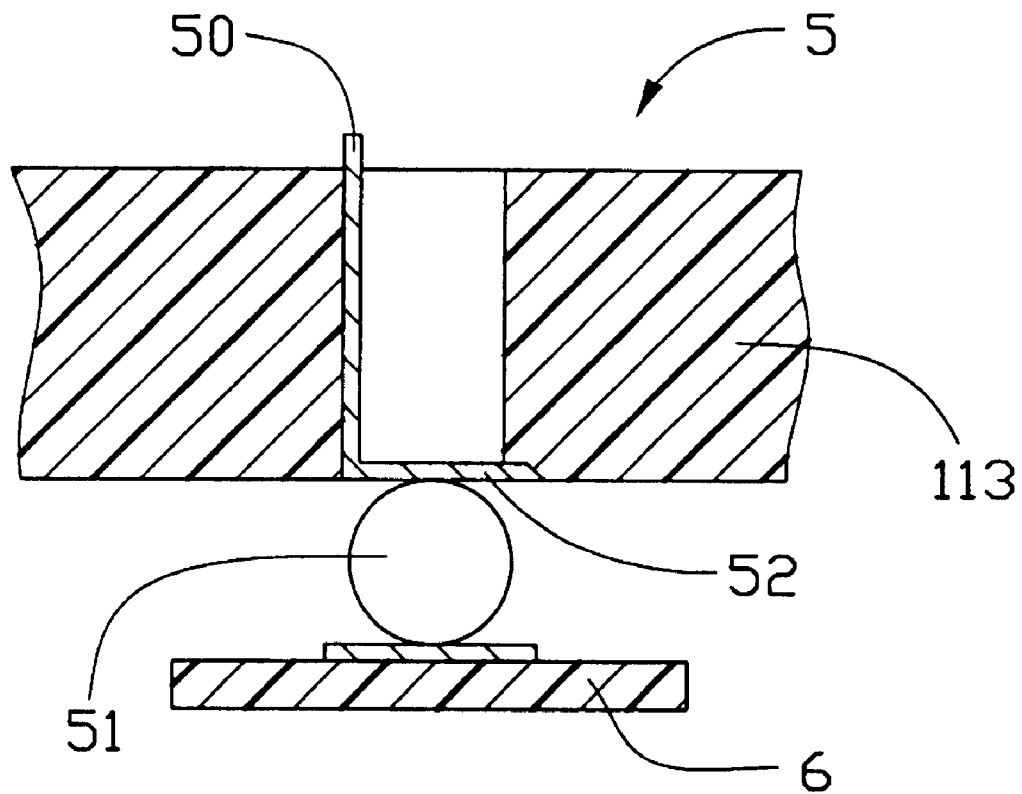
FIG. 6 is shows a prior art contact.

Referring to FIG. 5, a contact 3 in accordance with a fourth embodiment of the present invention comprises a connection portion 33. Two clip arms 341 extend from the connection portion 33. Two retention portions 3411 extend from the clip arms 341 for interferentially engaging with insulative housing of an electrical connector (not shown). The clip arms 341 further have two recesses 3412 formed therein and define a clip section 342. When the solder block 2 is inserted into the clip section 342 and is secured in a predetermined position, the two recesses 3412 can accommodate and engage with the solder ball 2 to position the solder ball 2 therebetween.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A contact for being received in an electrical socket which interconnects an integrated circuit (IC) package with a printed circuit board (PCB), the contact comprising:

a contact portion for electrically connecting with a pin of the IC package;

a locating portion extending from the contact portion for interferentially engaging with an insulative housing of the electrical socket; and a tail portion extending from a lower end of the locating portion with a plurality of clip arms extending generally in a horizontal domain; wherein when a solder block is engaged with the tail portion, the clip arms are deflectable in said domain to secure the solder block in a predetermined position in the tail portion.

2. The contact as described in claim 1, wherein the contact has a connection portion for connecting the location portion with the tail portion.

3. The contact as described in claim 2, wherein the connection portion has an opening formed therein to prevent solder wicking.

4. The contact as described in claim 2, wherein the clip arms of the tail portion form a ring-shaped section therebetween to secure the solder block therein.

5. The contact as described in claim 2, wherein the clip arms of the tail portion have two substantially parallel portions which are deflectable to secure the solder black therebetween.

6. The contact as described in claim 2, wherein the clip arms of the tail portion comprises two L-shaped arms, a third clip arm extends perpendicular to the two L-shaped arms, and wherein the solder block is securable in a space defined among the three clip arms.

7. The contact as described in claim 2, wherein the clip arms of the tail portion have two recesses formed therein for accommodating and engagingly receiving the solder block.

8. A contact including a locating portion, a resilient contact portion extending upwardly from said locating portion, a connection portion downwardly extending from said locating portion, and a horizontal tail portion perpendicularly extending generally in a horizontal domain from a lower end of said connection portion with radial expansibility thereof and defining therein an opening extending therethrough in a vertical direction, and a solder block forcibly inserted into said opening and retained by said tail portion.

9. The contact as described in claim 8, wherein said solder block is exposed on two opposite upper and lower sides of a plane defined by said tail portion.

* * * * *